United States Patent [19]

Najman

[11] Patent Number: 4,460,876
[45] Date of Patent: Jul. 17, 1984

[54] LOW CONSUMPTION, WIDE-BAND LINEAR AMPLIFIER OPERATING IN SLIDING CLASS A

[75] Inventor: Michel Najman, Paris, France

[73] Assignee: Thomson-CSF, Paris, France

[21] Appl. No.: 352,067

[22] Filed: Feb. 24, 1982

[30] Foreign Application Priority Data

Feb. 27, 1981 [FR] France .................................. 81 03988

[51] Int. Cl.$^3$ ............................................... H03F 3/04
[52] U.S. Cl. ....................................... 330/296; 330/311
[58] Field of Search .................. 330/70, 71, 296, 297, 330/311

[56] References Cited

U.S. PATENT DOCUMENTS 3,443,238 5/1969 Finn et al. .......................... 330/70 X

FOREIGN PATENT DOCUMENTS 52-67547 6/1977 Japan ................................... 330/296

Primary Examiner—James B. Mullins
Attorney, Agent, or Firm—Cushman, Darby and Cushman

[57] ABSTRACT

An amplifier is provided comprising an input transistor and an output transistor connected in series between two power supply terminals. The biassing of the base of the output transistor is determined by an impedance bridge coupling one of the supply terminals to the output of the amplifier. A "parallel resistor-capacitor" cell, coupled between the output transistor and the output of the amplifier, plays the role, with the base-emitter diode of the output transistor, of a detector circuit. This arrangement, by increasing the voltage at the terminals of the resistor of the cell depending on the detected signal, increases correlatively the current supplying the transistors as a function of the amplitude of the signals to be amplified.

2 Claims, 3 Drawing Figures

PRIOR ART
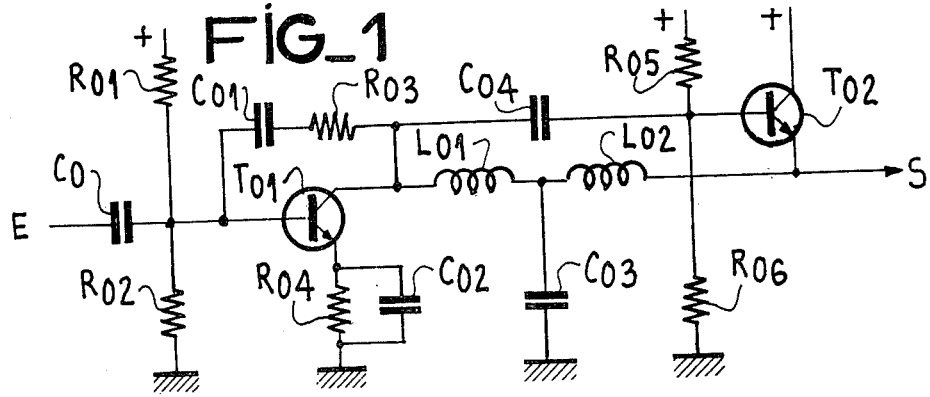
FIG_1
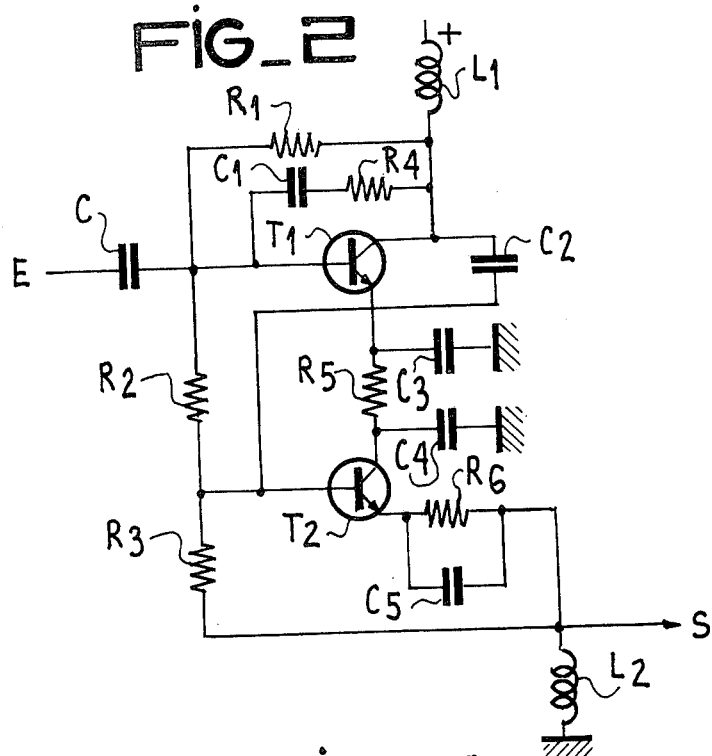
FIG_2
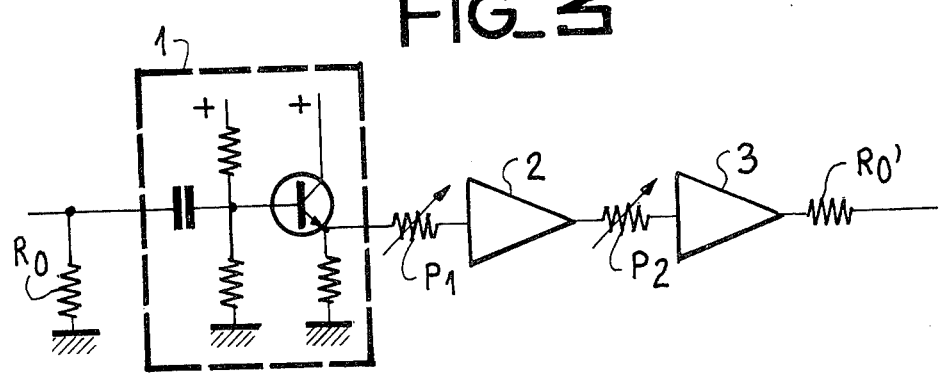
FIG_3

LOW CONSUMPTION, WIDE-BAND LINEAR AMPLIFIER OPERATING IN SLIDING CLASS A

BACKGROUND OF THE INVENTION

The present invention relates to a low power consumption, wide pass-band linear amplifier further having very low input and output impedances.

Such amplifiers are known and one embodiment of these known amplifiers is shown in to FIG. 1, the description of which appears further on.

The objective of zero impedances at the accesses to these amplifiers and high decoupling in the output access-input access direction generally suggests using circuits with two transistors, the first of which is connected in a common emitter configuration and comprises a shunt feed-back circuit and the second of which is connected in a common collector configuration. The objective low power consumption suggests to mounting the two transistors in series. The linearity objective suggests operating the two transistors in class A.

Among known amplifiers, those which perform best comprise, in series between the two terminals of their DC power supply, a "parallel resistor-capacitor" cell, followed by the input transistor of the amplifier, followed by the output transistor; the non-operating point in class A operation is fixed and is determined by the value of the resistor of the cell and the bias of the base of the input transistor. This non-operating point is chosen as a function of the maximum amplitude of the input signals to be amplified. With these amplifiers, even when the input signal is not at the maximum of its value, i.e. generally during the major part of its operation, the current to be supplied by the power supply is as high as when the input signal is at its maximum value. Moreover, with these known amplifiers, there appears a phase shift of the output signal with respect to the input signal, related to the level of the input signal and which may be troublesome when the input signal is large this phase shift being due to a non linearity of the active component of the amplifier.

SUMMARY OF THE INVENTION

The present invention substantially overcomes these disadvantages without requiring more expensive or more complicated circuits.

According to the invention, there is provided a low power consumption, wide pass-band linear amplifier comprising:

a first terminal and a second terminal for the DC power supply thereof, an output, and input transistor and an output transistor each having a base, an emitter, a collector, a base-emitter diode and a collector-emitter junction; these transistors having their collector-emitter junctions connected in series between said two terminals; and for reinjecting a part of the output signal of the amplifier at the base of the output transistor and for determining a sliding class A operation of the two transistors a bridge for biassing the base of the output transistor, connected to the output of the amplifier and to the first terminal, and a "parallel resistor-capacitor" cell coupled between the output transistor and the output of the amplifier for playing the role, with a base-emitter diode of the output transistor, of the detection circuit.

BRIEF DESCRIPTION OF THE DRAWINGS

The present invention will be better understood and other features will appear from the following description and the accompanying figures which represent:

FIG. 1, a diagram of a linear amplifier of the prior art,

FIG. 2, a diagram of a linear amplifier in accordance with the present invention, and FIG. 3, a diagram of a variable gain amplifier circuit equipped with amplifiers in accordance with FIG. 2.

DESCRIPTION OF THE PREFERRED EMBODIMENT

FIG. 1 shows an amplifier with two n-p-n transistors T01,T02, the first of which, connected in a common emitter configuration, forms the input transistor, the input E of the amplifier being connected through a capacitor C0 to the base of this transistor; the second transistor, connected in a common collector configuration, forms the output transistor, the output S of the amplifier being formed by the emitter of this transistor. The bases of transistors T01,T02 are biassed by means of two resistor bridges R01-R02 and R05-R06, respectively, connected between a terminal at a positive potential, shown as + in FIG. 1, and ground.

Transistor T01 comprises a shunt feedback circuit C01-R03, between its base and its collector, for lowering its input impedance. Transistor T01 is loaded by means of a high impedance, to alternating current, so as to have maximum voltage gain; this impedance is formed by an inductance L01 coupled between its collector and the first terminal of a capacitor C03, whose second terminal is connected to ground. A decoupling cell, formed by a resistor R04 in parallel across a capacitor C02, connects the emitter of transistor T01 to ground.

A capacitor C04 connects the collector of the input transistor T01 to the base of the output transistor T02. This output transistor is connected with common collector, its emitter being coupled to the + potential, and is loaded, like transistor T01, by means of a high impedance, to alternating current, so as to be able to deliver a maximum of power to the load intended to be connected to the output S of the amplifier.

In the circuit of FIG. 1, the two transistors operate in class A and their collector currents are substantially identical and equal to Ve/R04 where Ve is the DC voltage at the emitter of transistor T01 and is determined by the biassing of the base of this transistor; in this circuit, as was mentioned above, the current supplied by the power supply, i.e. substantially Ve/R04, is the same whether the signal to be amplified is of a high or low level.

FIG. 2 shows an amplifier with two n-p-n transistors T1,T2 which, for the amplifier of FIG. 1, are connected with common emitter and common collector configuration, respectively.

The input E of the amplifier is connected by a capacitor C to the base of transistor T1. The bases of transistors T1,T2 are biassed by an impedance bridge formed by the series connection, between a point of positive potential equal to +8V and shown as + in FIG. 2 and ground, of an inductance L1, a resistor R1, a resistor R2, a resistor R3 and an inductance L2; the base of transistor T1 is connected to the common point between resistors R1 and R2 and the base of transistor T2 is connected to the common point between resistors R2 and R3.

As in the case of FIG. 1, the input transistor T1 of FIG. 2 comprises a shunt feedback circuit C1-R4 between its base and its collector, for lowering its input impedance.

The collector of transistor T1 is connected, on the one hand, to the common point between impedance L1 and resistor R1 and, on the otherhand, through a capacitor C2 to the base of the output transistor T2.

The emitter of transistor T1 is connected, through resistor R5, to the collector of transistor T2 and the two terminals of reistor R5 are further connected to ground respectively through two capacitors C3 and C4. As for the emitter of transistor T2, it is connected, by means of a cell formed from a resistor R6 in parallel across a capacitor C5, to the common point between resistor R3 and inductance L2, this common point forming the output S of the amplifier.

Besides the similarities already pointed out between this circuit (FIG. 2) and that of FIG. 1, it should be noted that here also the two transistors are in series between the two power supply terminals (+ potential and ground) and that they are loaded by means of high impedances, to alternating current, formed by inductances L1 and L2.

However, there are also significant differences. In the circuit of FIG. 2, the biassing of the bases of the two transistors is achieved by a single biassing bridge and this bridge is no longer simply connected between the two terminals of the power supply (+ and ground) but connects the output terminal S to the + potential point while passing through the bases of the two transistors; furthermore, the cell R04-C02 which determined, with the biassing of the base of the input transistor, the current supplying the two transistors of FIG. 1, is replaced by a cell R6-C5 coupled between the emitter of transistor T2 and the output S; this cell determines, depending on the voltage at the base of transistor T2, the supply current Ia which is substantially the same for both transistors and which equals, as long as the signals to be amplified are of a low level $$Ia = (Vb - Vbe)/R6$$

where Vb is the DC voltage on the base of transistor T2 and Vbe the base-emitter voltage of transistor T2.

Cell R6-C5, since it forms with the base-emitter diode of transistor T2 a detection circuit, causes an increase in the DC voltage at the terminals of resistor R6 whenever the signals to be amplified have a level sufficient for the AC voltage at the base of transistor T2 to exceed the detection threshold of this detector. The supply current then becomes $$Ia = (Vb - Vbe + Vd)/R6$$

where Vd is the detected voltage; the operation is then a sliding class A operation for both transistors T1 and T2 since their DC emitter-collector current increases as the level of the input signal increases; this results in very considerably reducing the amplitude-phase conversion with respect to what is observed with an amplifier such as shown in FIG. 1.

Another advantage of the amplifier of FIG. 2 with respect to that of FIG. 1 is its greater ease of construction from microcircuits; in fact, since inductances cannot be constructed as microcircuits, the microcircuit for the amplifier of FIG. 1 must comprise six terminals (E,S,+, ground and the two ends of the inductance L01) whereas that for the amplifier of FIG. 2 only requires four (E,S,ground and the common point between inductance L1 and resistor R1).

The amplifier of FIG. 2 has been constructed with the following elements:
T1,T2: transistors NE021-35 of N.E.C.
L1=L2=10 μH
C=C1=C2=C3=C4=C5=10 nF
R1=2.2 k ohms
R2=3 k ohms
R3=1.6 k ohms
R4=820 ohms
R5=22 ohms
R6=68 ohms the characteristics of this amplifier are the following:
gain: 11 dB
pass-band: 5 MHz–300 MHz at 3 dB with a flat part from 10 to 100 MHz
consumption: 12.5 mA with a low level input signal and 16 mA with a high level input signal.

Other embodiments of amplifiers are possible without departing from the scope of the invention: thus, the circuit of FIG. 2 may be constructed from p-n-p transistors by replacing the positive potential point + by a negative potential point and adapting the value of this potential and the values of the resistors of the bridge for biassing the base of the transistors to the characteristics of these transistors.

Similarly, the biassing of the base of the two transistors may be achieved by means of two separate impedance bridges.

Because of its low power input and output impedances, its low consumption and its great linearity due to sliding class A operation, the amplifier of FIG. 2 is particularly suitable for the construction of variable gain amplifier circuits such as shown schematically in FIG. 3.

FIG. 3 shows a variable gain control amplifier circuit formed from a resistor R0 followed by an amplifier 1, a connecting impedance P1, an amplifier 2, a connecting impedance P2, and amplifier 3 and a resistor R0'. In this circuit, amplifiers 2 and 3 are identical with the amplifier of FIG. 2, resistors R0 and R0' are matching resistors of a value of 50 ohms and the connecting impedances P1, P2 shown symbolically by a variable resistor are in fact resistive circuits with variable impedance depending on the value of the signal applied to their control input. As for circuit 1, it is a conventional 0 dB gain amplifier, playing the role of impedance separator so that there is always present, at the input of the amplifier circuit, an impedance of value R0, whatever the value assumed by P1. Such an amplifier circuit has a gain capable of varying from 0 to 22 dB. It is also possible to construct amplifier circuits only comprising, between amplifier 1 and resistor R0', the assembly formed from an amplifier (2) and its associated impedance (P1) or comprising more than two of these assemblies connected in series between the amplifier 1 and the resistor R0'; it is also possible to construct such gain control amplifier circuits comprising several amplifier such as 2 but in which only a part of the impedances associated therewith, such as P1, are variable. In the amplifier circuit of FIG. 3, it should be noted that circuit 1 may be replaced by an amplifier such as shown in FIG. 2 which will introduce a constant gain of 11 dB and will have the role of impedance separator.

What is claimed is:

1. A linear amplifier, with low consumption and a wide pass-band, comprising:
   first and second power terminals for supplying DC power to said amplifier;
   an output terminal
   an input transistor and an output transistor each transistor comprising a base, an emitter, a collector, a base-emitter diode and a collector-emitter junction; these two transistors having their respective collector-emitter junctions connected in series between said first and second terminals;
   a bridge for biasing the base of the output transistor, connected to the output of the amplifier and to the first terminal; and
   a "parallel resistor-capacitor" cell, coupled between the output transistor and the output of the amplifier, for functioning with the base-emitter diode of the output transistor to provide a detection circuit the bridge and "parallel resistor-capacitor" cell providing a re-injection of a part of a signal output of said amplifier and causing a sliding class A operation.

2. The linear amplifier as claimed in claim 1, wherein the biasing bridge comprises:
   a first inductance coupled between the first power terminal and the collector of the input transistor,
   a first resistor coupled between the collector and the base of the input transistor,
   a second resistor coupled between the bases of the input and output transistors,
   a third resistor coupled between the base of the output transistor and the output terminal, and
   a second inductance coupled between the output and the second power terminal.

* * * * *